(12) United States Patent
Zheng et al.

(10) Patent No.: US 6,399,432 B1
(45) Date of Patent: Jun. 4, 2002

(54) PROCESS TO CONTROL POLY SILICON PROFILES IN A DUAL DOPED POLY SILICON PROCESS

(75) Inventors: Tammy Zheng; Subhas Bothra, both of San Jose, CA (US)

(73) Assignee: Philips Semiconductors Inc., Tarrytown, NY (US)

( * ) Notice: Subject to any disclaimer, the term of this patent is extended or adjusted under 35 U.S.C. 154(b) by 0 days.

(21) Appl. No.: 09/199,203

(22) Filed: Nov. 24, 1998

(51) Int. Cl.[7] ........................................... H01L 21/8238
(52) U.S. Cl. ........................ 438/232; 438/231; 438/223; 438/224; 438/305; 438/306
(58) Field of Search ................................ 438/217, 305, 438/218, 223, 224, 228, 231, 232, 230, 227, 306, 532; 257/369, 338, 371, 372

(56) References Cited

U.S. PATENT DOCUMENTS

| | | | |
|---|---|---|---|
| 4,373,249 A | * 2/1983 | Kosa et al. ................... 29/571 |
| 5,336,355 A | 8/1994 | Zarowin et al. | |
| 5,438,006 A | 8/1995 | Chang et al. | |
| 5,529,197 A | 6/1996 | Grewal | |
| 5,629,544 A | 5/1997 | Voldman et al. | |
| 5,652,172 A | 7/1997 | Yung-Sung et al. | |
| 5,654,570 A | * 8/1997 | Angello ....................... 257/338 |
| 5,677,563 A | 10/1997 | Cronin et al. | |
| 5,718,800 A | 2/1998 | Juengling | |
| 5,739,066 A | 4/1998 | Pan | |
| 5,789,295 A | 8/1998 | Liu | |
| 5,827,747 A | * 10/1998 | Wang et al. .................. 438/199 |
| 5,830,789 A | * 11/1998 | Lien et al. .................... 438/217 |
| 5,831,313 A | * 11/1998 | Han et al. .................... 257/371 |
| 5,956,584 A | * 9/1999 | Wu ............................. 438/232 |

OTHER PUBLICATIONS

May 1990.*
S. Wolf, Silicon Processing for the VLSI Era, vol. 2, Process Integration, May 1990.*

* cited by examiner

Primary Examiner—Matthew Smith
Assistant Examiner—Belur O Keshavan

(57) ABSTRACT

For use with sub-micron CMOS technologies, a gate etch process improves control of the etch profile. Gate stacks utilize N-type or P-type doped amorphous or poly silicon to enhance device performance. However, the different etching characteristics of the N-type versus the P-type amorphous or poly silicon material can result in a localized breakthrough of the underlying thin gate oxide adjacent to the edge of the gate stack, especially in the N doped active regions. According to one example embodiment, this localized breakthrough ("microtrenching") is avoided by building the gate stacks with undoped amorphous or poly silicon to the desired configuration, masking the gate stacks with a dielectric layer, planarizing the dielectric layer and then implanting the N-type or P-type species into the selected gate stack.

22 Claims, 4 Drawing Sheets

PROCESS TO CONTROL POLY SILICON PROFILES IN A DUAL DOPED POLY SILICON PROCESS

FIELD OF INVENTION

The present invention is generally directed to the manufacture of a semiconductor device. In particular, the present invention relates to a process that reduces the likelihood of localized breakthrough in the thin gate oxidation near the edges of a poly-silicon or amorphous-silicon gate stack.

BACKGROUND OF INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (NOS) transistors, such as P-channel MOS (PMOS), N-channel MOS (NMOS) and complementary MOS (CMOS) transistors, bipolar transistors, BiCMOS transistors, etc.

Each of these semiconductor devices generally includes a semiconductor substrate on which a number of active devices are formed. The particular structure of a given active device can vary between device types. For example, in MOS transistor, an active device generally includes a source and drain region and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photoresist-coated substrate. Unexposed areas of resist are washed away. The wafer having the desired features defined is subjected to etching. Depending upon the production process, the etching may either be a wet etch in which liquid chemicals are used to remove wafer material or a dry etch in which wafer material is subjected to a radio frequency (RF) induced plasma. A challenge in the etching process is maintaining control over the etching of the features, notably in the gate electrode region of the MOS transistor.

One of the challenges during the gate etch process of sub-micron technologies is the control of the etch profile. In many modern sub-micron processes, the gate electrode is comprised of a composite of layers of materials "stacked" on top of one another, hence the name, "gate stack." In an example process, a CMOS transistor with a gate stack comprising 1000 Å of W, 500 Å of TiN provides a sheet resistance as low as $3\Omega/\square$ and a higher breakdown voltage for the gate oxide.

A commonly used gate stack is amorphous silicon ($\alpha$-Si) or poly silicon (poly-Si) on top of a thin gate oxide. The $\alpha$-Si or poly-Si is typically doped with N-type carriers for NMOS or with P-type carriers for PMOS to obtain asymmetry threshold voltage between N-channel and P-channel devices for a CMOS device. As the technologies evolve, the dimensions of integrated circuits shrink. As the IC dimensions get smaller, a thinner gate oxide is needed to maintain a level of gate capacitance for the performance of the IC devices. To avoid increasing the capacitance above the desired level, it is necessary to maintain a high conductivity in the $\alpha$-Si or poly-Si to prevent the depletion of carriers in the gate region. This depletion of carriers tends to make the $\alpha$-Si or poly-Si appear as an additional "oxide thickness" contributing series capacitance component that tends to lower the overall gate capacitance. For an example process having 100 Å oxide, if the gate stack contributes 5 Å of "oxide thickness", the capacitance change would be about 5% (assuming other parameters are held constant). However, if a process has a 30 Å gate, with a 5 Å change in thickness due to the oxide, the gate capacitance would change about 20%. Therefore, the N-type and P-type doses required for the $\alpha$-Si or poly-Si gate stack may be heavier. The thinning of the gate oxidation and the doping heavily of the $\alpha$-Si and poly-Si with N-type or P-type carriers present a major challenge to the gate etch process.

Different doping types, doses, and activation level of the $\alpha$-Si or poly-Si have a significant effect on the $\alpha$-Si or poly-Si etch rate as well as the etch profile. N-doped $\alpha$-Si or poly-Si usually etches faster than P-doped $\alpha$-Si or poly-Si in a plasma etch process. To adequately etch the P-type material there is a possibility of etching the N-type material too much. The excessive etching may cause the localized breakthrough, "micro-trenching," of the thin gate oxidation in the bottom of the $\alpha$-Si or poly-Si etch features.

In a typical $\alpha$-Si or poly-Si gate plasma etching process, a main-etch step with an optical endpoint is used to define the gate profile. The endpoint signal will trigger only when the $\alpha$-Si or poly-Si begins clearing out of the wafer. At this point, there will be less N-doped $\alpha$-Si remaining than P-doped Si. Some N-doped $\alpha$-Si may have been completely etched away. The etch process will break through the thin gate oxide and rapidly etch the underlying silicon substrate. After reaching the endpoint (or after the main-etch step) the process switches to a higher $Si/SiO_2$ selectivity over-etch step and completely removes all of the remaining $\alpha$-Si (or poly-Si). The selectivity of the over-etch step is much more than that of the main-etch step. This assures a reasonable gate profile.

With a relatively thin gate oxide, micro-trenching is problematic, especially in N-doped areas. In a plasma etch process, gate etch profile is also very sensitive to the doping of $\alpha$-Si or poly-Si. In addition, the doping profiles between N-doped and P-doped $\alpha$-Si or poly-Si may be different especially for dense $\alpha$-Si or poly-Si lines.

Accordingly, there is a need to maintain a good gate etch profile that is substantially free of micro-trenching and provides a consistent gate etch profile between N-type and P-type doped gate stacks as well as good critical dimension control as the process technology is approaching fractional microns in feature sizes.

SUMMARY OF INVENTION

The present invention is exemplified in a number of implementations, several of which are summarized below. According to one embodiment, a method for building a gate structure over a thin oxide region in a semiconductor device having a silicon region of a first polarity type comprises forming a layer of undoped silicon coupled to and over the thin oxide region. At least one gate region on the undoped silicon is defined on the thin oxide region. The thin oxide region is over the silicon region of a first polarity type. A drain and source region of a second polarity type is defined. Next, a dielectric layer over the gate region is then formed. The layer of undoped silicon coupled to the thin oxide region is transformed into silicon of a second polarity type.

According to another embodiment, a CMOS device structure has P-well and N-well regions, trench isolation regions separating the wells and other device structures, and a thin oxide region. A method for building a CMOS gate stack structure comprises first forming a layer of undoped silicon coupled to and over the thin oxide region. Second, a layer of undoped silicon coupled to the thin oxide regions is formed. Third, at least one gate region on the undoped silicon is defined on the thin oxide over the P-well and at least one gate region on the undoped silicon is formed on the thin oxide over the N-well regions in the device structure. The source and drain regions of the device structure then undergo ion implant. Next, a dielectric layer is deposited onto the gate region, and this dielectric region is planarized until the top surface of the gate region is exposed. The undoped silicon in the P-well is implanted to form an N-type stack. In addition, the undoped silicon of the N-well is implanted to form a P-type stack. The dielectric layer is removed until the thin oxide region is exposed and spacers are formed around the N-type gate stack and P-type gate stack.

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which:

FIG. 2A illustrates in cross-section a transistor structure before definition of the gates;

FIG. 2B illustrates the transistor of FIG. 2A at the gate masking step;

FIG. 2C illustrates the transistor of FIG. 2B after patterning of the gate stack;

FIG. 2D illustrates the transistor of FIG. 2C after the source and drain regions of the CMOS transistor structure;

FIG. 2E illustrates the transistor of FIG. 2D after deposition of a silicon nitride layer;

FIG. 2F illustrates the transistor of FIG. 2E after planarization of the silicon nitride layer;

FIG. 2G illustrates the CMOS transistor of FIG. 2F undergoing N-type ion implantation of the poly-Si or α-Si gate of the N-channel transistor;

FIG. 2H illustrates the CMOS transistor of FIG. 2G undergoing P-type ion implantation of the poly-Si or (α-Si gate of the P-channel transistor;

FIG. 2I illustrates the CMOS transistor of FIG. 2H after removal of the silicon nitride layer; and FIG. 2J illustrates the transistor of FIG. 2I after TEOS spacer definition.

Figure 1:
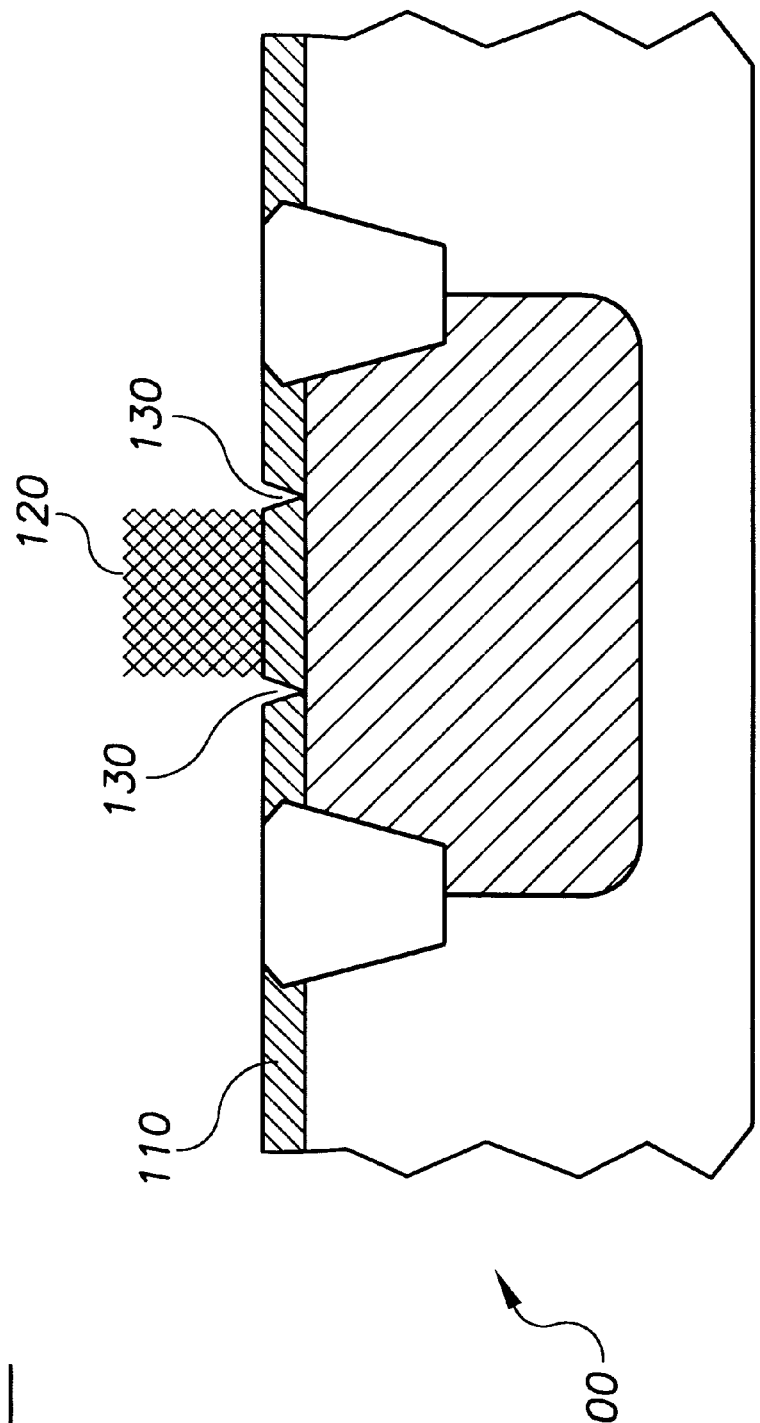
FIG. 1 illustrates, according to the prior art, "microtrenching" of the thin gate oxide at the edge of the amorphous poly-silicon gate stack of an NMOS transistor after gate etch.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found to be useful and advantageous in connection with etch processes used to manufacture MOS-type transistors. The present invention has been found to be particularly useful where it is difficult to control the etch profile in a gate stack and to assure that the underlying thin oxide layer is not attacked during the etching. In the discussion that follows, a MOS structure is used to describe an example implementation of the invention. However, the invention is not necessarily limited to MOS. It may be applied to alternate technologies such as bipolar, silicon on substrate, gallium arsenide, and combinations thereof.

FIG. 1 depicts an example NMOS transistor device 100 built with a modem sub-0.25 μm process. Due to plasma etching, a thin gate oxide region 110 exhibits microtrenching 130 near the bottom and adjacent to an N-doped α-Si or poly-Si region 120 that covers the gate of the transistor device. Since the gate oxide can be in the range of approximately 25 Å to 100 Å, micro-trenching affects the characteristics of the CMOS transistor gate and ultimately degrades the performance. Such degradation of performance affects yield and reliability and can result in increased processing costs.

To address the microtrenching of the thin oxide in an example process according to the present invention, the process begins with the deposition of undoped α-Si or poly-Si. The gate regions are defined through conventional photo-lithographic techniques. After masking, the undoped gate regions are etched. Since an undoped gate has been defined for either an NMOS transistor or a PMOS transistor the problem of the prior art process of mismatched etch rates of the N-doped and P-doped gate stacks is minimized. Next, the source and drain of the transistor are defined. A dielectric layer is deposited over the transistor structure. Then the dielectric layer is planarized until the gate stack is exposed. After the planarization, the α-Si or poly-Si gate stack undergoes ion implantation. Depending upon the type of transistor, the α-Si or poly-Si is either biased P-type or N-type. After doping the gate stacks, the transistors undergo further processing. The gates of the transistors have already been etched and defined while in the undoped state. Consequently, the prior art microtrenching associated with the simultaneous etching of a P-type gate stack and an N-type gate stack of prior art processes is avoided.

In FIGS. 2A–2J, a series of cross-sectional views illustrates another example process according to the present invention. The process begins after the deposition of amorphous silicon (α-Si). In another example embodiment, poly silicon (poly-Si) may be used in place of α-Si. To build the underlying structures, the steps preceding the deposition of the α-Si and poly-Si may be accomplished with a modern sub-micron CMOS process.

Figure 2A:
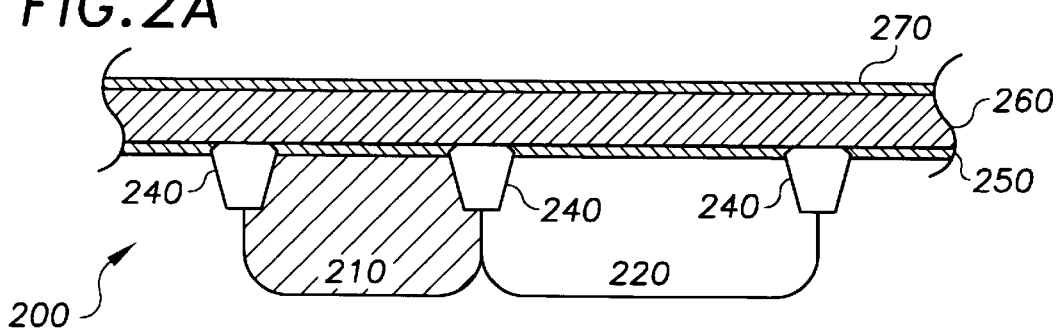
FIGS. 2A–2J illustrate an example set of steps used in connection with an example implementation of the present invention.

In FIG. 2A, a CMOS device structure 200 is shown with dual wells, the P-well 210 is adjacent to the N-well 220. STI (shallow trench isolation) oxide regions 240 isolate the device structure 200 from others. A thin oxide layer, 250 with a thickness in the range of 25 Å to 100 Å covers the dual well regions. About 1000 Å to 3000 Å of an undoped α-Si layer 260 is deposited upon the thin oxide layer 250.

The bottom anti-reflective coating (BARC) layer 270 is formed over the α-Si layer 260 to reduce the reflection of light during a subsequent photo-lithographic patterning process. Metals, such as aluminum, tungsten, and copper, typically have a relatively high reflectivity. Therefore, it is often necessary to provide an ARC layer with reduced reflectivity to reduce the broadening or narrowing of features. For example, in the absence of the ARC layer 270, "reflective notching" occurs when the topography of the underlying surface (e.g., a slope in the topography) causes the reflection of light at angles that are not perpendicular to the surface of the photo-resist. The ARC layer may enhance adhesion of subsequently deposited dielectric layers.

Materials suitable for the ARC layer 270 typically have low reflectivity of light for the wavelength range used to form the pattern. Therefore, the particular materials useful for forming the ARC layer 270 depend on the size of the features and the design rules. For 0.25 $\mu$m design rules, titanium nitride is a useful material for the BARC layer 270. Other suitable materials for the BARC layer 270 include, for example, silicon oxynitride, silicon nitride, silicon dioxide, and organic ARC materials. Although the ARC material may be non-conductive, it may be often desirable to use a conductive ARC. Otherwise, the ARC material needs to be removed, at least in via locations, to allow connection between the gate stack structure 260 and subsequently formed interconnects or contacts.

Figure 2B:
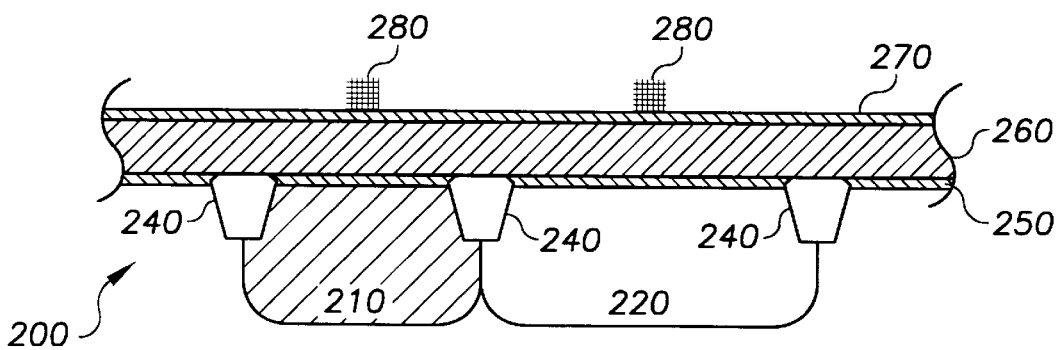
Figure 2C:
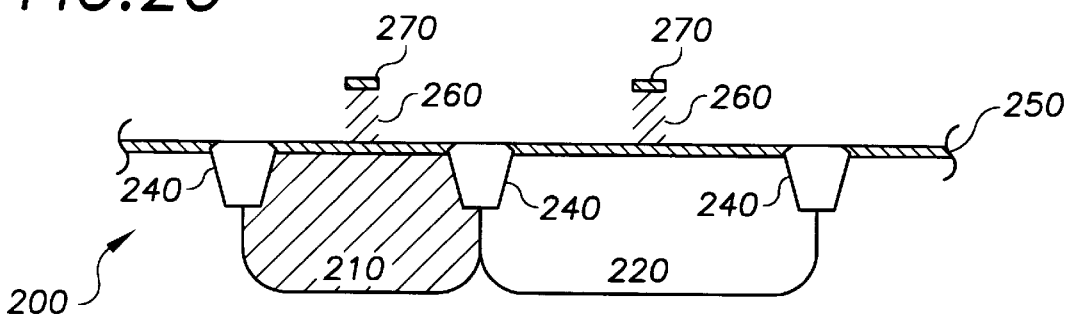

Referring to FIG. 2B, the α-Si mask layer 280 is defined on the BARC layer 270. The α-Si (or poly-Si) is patterned with standard photo-lithographic techniques to define the gate regions of the CMOS device structure 200. The unmasked areas of undoped α-Si is removed with a plasma etch process. Since the undoped (α-Si is present on both the NMOS and PMOS transistor structures, the two gate stacks will have the same etching characteristics. Photo resist is plasma ashed and the device structure is cleaned. The α-Si layer 260 undergoes annealing. An additional 100 Å oxide is formed with a re-oxidation step at about 850° C. FIG. 2C shows the resulting structure.

Figure 2D:
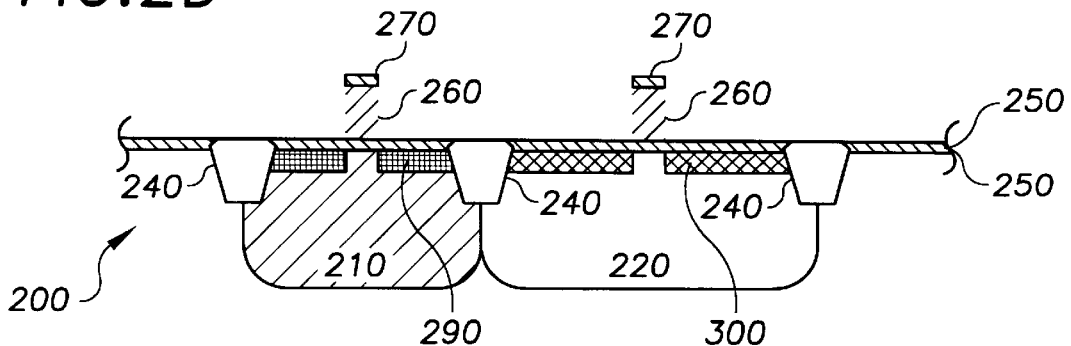

In FIG. 2D, N+ regions 290 are implanted in the P-well 210 to define the source and drain regions of the NMOS transistor. Likewise, in N-well 220, the process defines the corresponding P+ regions 300 of the PMOS transistor. In an example sub-micron process, the N+ regions 290 are defined in the P-well 210 during a NLDD implant process of arsenic combined with an N-pocket implant of boron-11. The corresponding P+ regions 300 are defined in the N-well 220 during a PLDD implant process of $BF_2$ combined with the P-pocket implant of phosphorus.

Figure 2E:
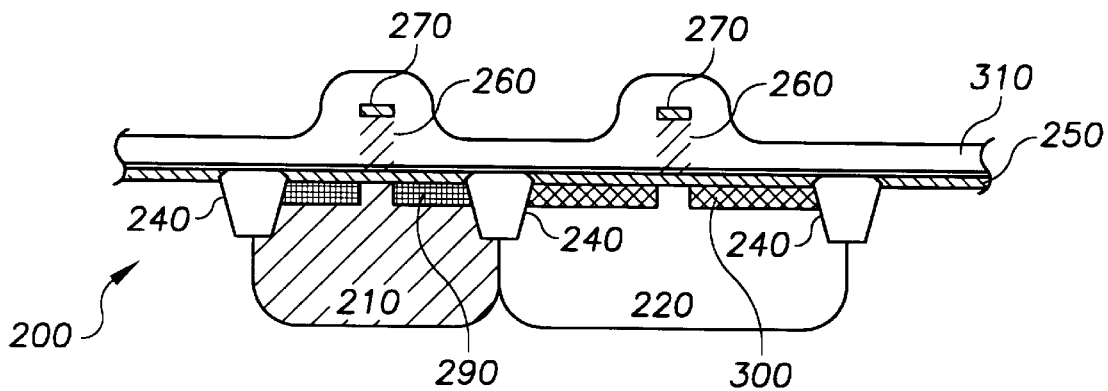
Figure 2F:
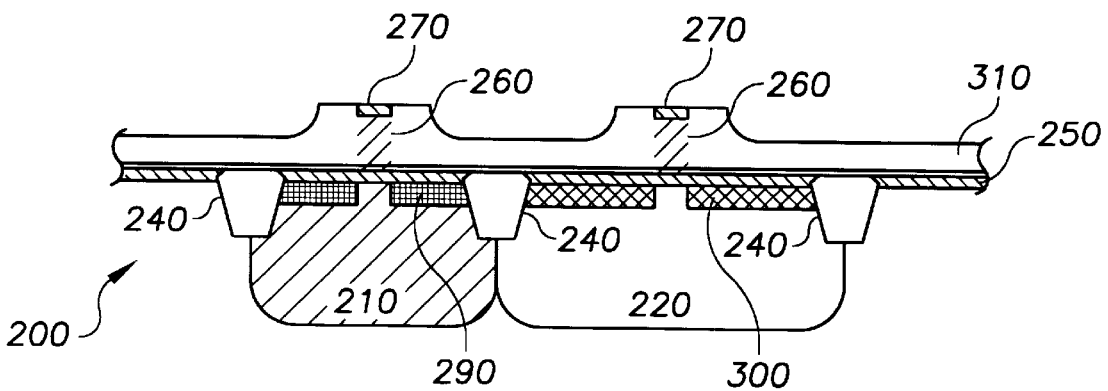

Referring to FIG 2E, after forming the sources and drains of the CMOS transistor pair, a layer 310 of dielectric is deposited. This layer in one example embodiment is silicon nitride having a thickness of about 2000 Å. This deposition is used to block the N-type and P-type doped implants of subsequently discussed α-Si or poly-Si implant steps. After depositing this dielectric 310, a chemical-mechanical polishing (CMP) procedure planarizes and polishes the dielectric layer 310 until the BARC layer 270 is exposed as shown in FIG. 2F. In another example CMP procedure, if the CMP selectivity to the BARC layer 270 is insufficient to make a reliable "end of CMP" indication, the CMP stops when it reaches the top surface of the α-Si or poly-Si 260 without adverse results. In another example process a similar structure, as depicted in FIG. 2F, can be obtained through conventional etch back processes.

Figure 2G:
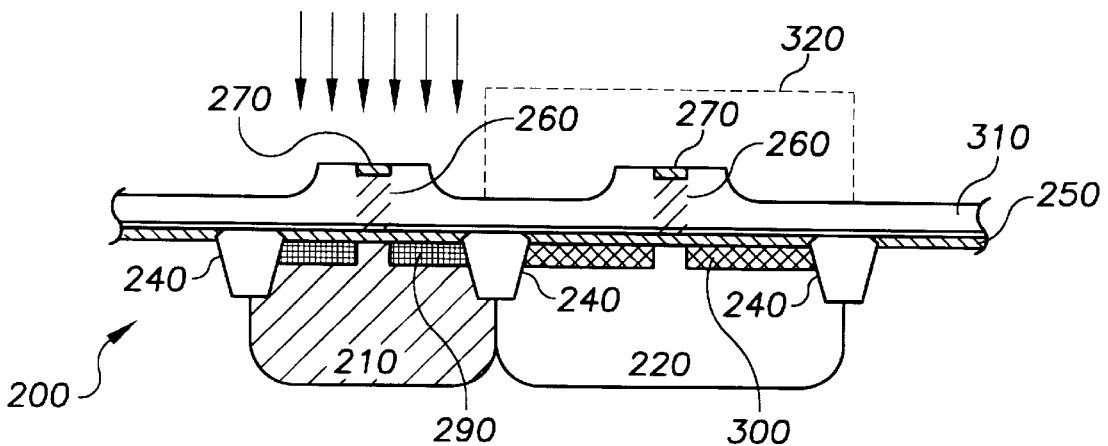
Figure 2H:
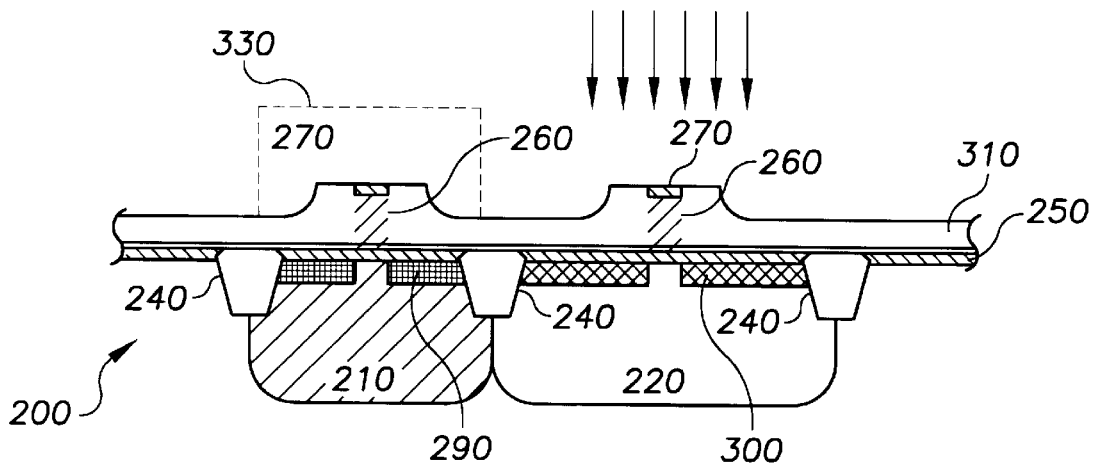

After completing the planarization of the dielectric layer 310, the device structure 200, as depicted in FIG. 2G, undergoes N-type ion implantation of the α-Si or poly-Si gate stack in the transistor defined by the P-well 210. The N-well region of the P-channel transistor and its α-Si or poly-Si gate stack are shielded by mask 320. After the N-type ion implantation step, the mask 320 is removed by conventional techniques and the same process is repeated for the device structure 200 as depicted in FIG. 2H. However, the α-Si or poly-Si is biased P-type through ion implantation. The photo mask 330 shields the N-type α-Si or poly-Si gate stack of the N-channel transistor (in the P-well 210).

In an example 0.25 $\mu$m process, for N-type α-Si, phosphorus is implanted at a dose of $3 \times 10^{15}$ atoms/cm$^2$ at an energy of 50 KeV. For P-type α-Si, boron is implanted at a dose of $1 \times 10^{15}$ atoms/cm$^2$ at an energy of 20 Kev. As the critical dimensions shrink, heavier doping is often necessary. For an example 0.20 $\mu$m process, the N-type dose remains the same. However, the P-type dose of boron is increased to $2 \times 10^{15}$ atoms/cm$^2$ with the same 20 KeV energy of the example 0.25 $\mu$m process.

Figure 2I:
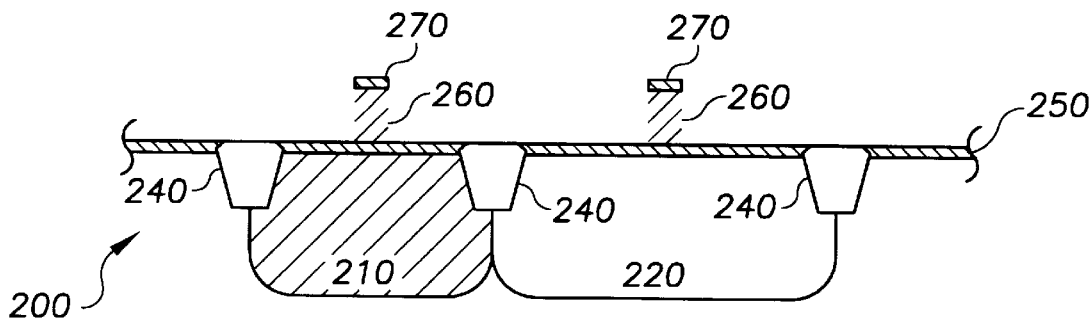

Referring now to FIG. 2I, in one example process, the silicon nitride dielectric layer 310 is removed with a wet etch. A spacer (or dielectric) material is deposited over the gate stack structures to protect them from subsequent processing. The spacer material is typically formed as a conformal layer over the underlying structures and may be formed by a variety of techniques including, among others, chemical vapor deposition (CVD), physical vapor deposition, or spin-on techniques. In particular, CVD is a commonly used method for forming a conformal layer over a surface having structure. The spacer material may use a variety of materials. Oxides and nitrides, such as silicon dioxide, silicon nitride, and silicon oxynitride, are used often as spacer materials. Photo resist may also be a convenient spacer material as it can be easily formed on the structures by a CVD process and easily removed by techniques, such as ashing. Ashing involves using an $O_2$ plasma to "burn" off the organic photoresist compounds.

In an example spacer formation process, the device structure of FIG. 2I undergoes a Thermally Enhanced Oxidation of Silicon (TEOS) process. An example process deposits approximately 1600 Å of TEOS. Next, in a densification process at 1000° C., the deposited TEOS undergoes a Rapid Thermal Annealing (RTA) for approximately 60 seconds. After the annealing, the oxide is etched in a mixture of $CF_4$ and $CHF_3$. In one particular example process, the recipe includes a mixture of three gases in the range of approximately, $CF_4$ at 9 sccm, $CHF_3$ at 36 sccm, a carrier gas Ar at 100 sccm. These gases may be set at a pressure of approximately 20 mT. The plasma reactor's power settings are adjusted to approximately 500 Watts on the wafer's top surface and 800 Watts underneath the wafer's bottom surface. Etching proceeds until an end of etch endpoint is detected.

Figure 2J:
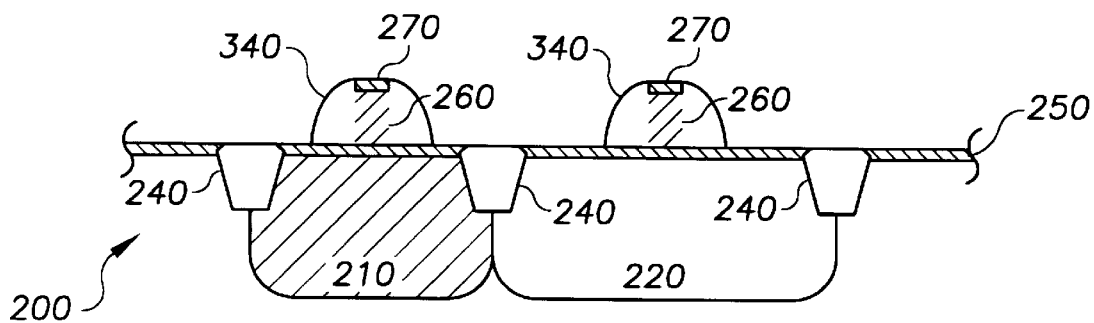

FIG. 2J illustrates a resulting structure with the TEOS spacers 340. The process proceeds through conventional means until the device structure 200 is completed.

In an alternative process, after the P-type and N-type α-Si or poly-Si implant steps, the silicon nitride film 310 is not removed with a wet etch. Rather than etch off the nitride dielectric layer 310 of FIG. 2H and then redeposit another dielectric layer to form spacers, spacers are made from the existing nitride dielectric layer 310. An etch containing a mixture of $CF_4$ and $O_2$ optimized for the nitride dielectric layer 310 can be used to obtain a proper nitride spacer 340 of FIG. 2J. In an example process, the recipe includes a pressure maintained at approximately 200 mT and a mixture of three gases in the range of approximately, $O_2$ at 15 sccm, $CF_4$ at 60 sccm, and a carrier gas Ar at 100 sccm. Power is set to approximately 700 Watts. Etching proceeds until the desired profile is achieved. The desired profile is calibrated to a corresponding endpoint indication.

While the present invention has been described with reference to several particular example embodiments, those skilled in the art will recognize that many changes may be made thereto without departing from the spirit and scope of the present invention, which is set forth in the following claims.

What is claimed:

1. A method of manufacturing a semiconductor device structure having a thin oxide region over a silicon region of a first polarity type, comprising:
    forming a layer of undoped silicon coupled to and over the thin oxide region;
    defining at least one gate region over the undoped silicon;
    defining a source region and a drain region of a second polarity type in the silicon region of the first polarity type and on either side of the gate region;
    forming a dielectric layer over the gate region; and
    transforming the layer of undoped silicon into the second polarity type.

2. The method of claim 1 wherein the first polarity type is of opposite polarity from the second polarity type.

3. The method of claim 2 wherein the first polarity type is negative.

4. The method of claim 2 wherein the first polarity type is positive.

5. The method claim 1, wherein transforming the layer of undoped silicon comprises the implanting of a dopant of a second polarity type.

6. The method of claim 1, wherein the layer of undoped silicon comprises at least one of following from the group consisting of: poly-crystalline silicon and amorphous silicon.

7. The method of claim 1, wherein the dielectric layer includes at least one of the following from the group consisting of: silicon oxides and silicon nitrides.

8. The method of claim 1, wherein transforming the layer of undoped silicon into a second polarity type includes using compounds that include at least one of the group consisting of: Phosphorus, Arsenic, Antimony and Bismuth.

9. The method of claim 1 wherein transforming the layer of undoped silicon into a second polarity type includes using compounds of Boron.

10. The method of claim 1, wherein the region of the first polarity type includes at least one of the group consisting of: Phosphorus, Arsenic, Antimony and Bismuth.

11. The method of claim 1, wherein the region of the first polarity type includes Boron.

12. A semiconductor device fabricated with the method of claim 1.

13. In a CMOS device structure having a P-well and an N-well regions, trench isolation regions separating the well regions and other semiconductor device structures, a thin oxide region, a method for manufacturing an IC having a CMOS gate stack structure, comprising:
    forming a layer of undoped silicon coupled to the thin oxide region;
    defining at least one gate region on the undoped silicon over the P-well and defining at least one gate region on the undoped silicon over the N-well regions in the device structure;
    implanting the source and drain regions of the device structure;
    depositing a dielectric layer onto the gate region;
    planarizing the dielectric layer until the top surface of the gate region is exposed;
    implanting N-type species in the undoped silicon in the P-well gate region to form an N-type gate stack;
    implanting P-type species in the undoped silicon in the N-well gate region to form a P-type gate stack;
    removing the dielectric layer until the thin oxide region is exposed; and
    forming a spacer around the N-type gate stack and the P-type gate stack.

14. In a CMOS device structure having a P-well region and an N-well region, trench isolation regions separating the wells and other semiconductor device structures, a thin oxide region, a method for manufacturing an IC having a CMOS gate stack structure, comprising:
    forming a layer of undoped silicon having a top surface and a bottom surface, the bottom surface coupled to the thin oxide region;

defining at least one gate region on the undoped silicon formed on the thin oxide over the P-well and defining at least one gate region on the undoped silicon formed on the thin oxide over the N-well regions in the device structure;

implanting n+ regions in the P-well and implanting p+ regions in the N-well to define the source and drain regions of the device structure;

depositing a dielectric layer until it envelopes the gate region;

planarizing the dielectric layer until the top surface of the gate region is exposed;

implanting N-type species in the undoped silicon in the P-well gate region to form an N-type gate stack;

implanting P-type species in the undoped silicon in the N-well gate region to form a P-type gate stack;

removing the dielectric layer until the thin oxide region is exposed; and forming a spacer around the N-type gate stack and the P-type gate stack.

15. The method as recited in claim 14, wherein forming the layer of undoped silicon includes using undoped silicon selected from the group consisting of: amorphous silicon and poly silicon.

16. The method as recited in claim 15 wherein defining at least one gate region further comprises:

depositing an anti-reflective coating on the undoped silicon;

masking the gate regions with a photo resist, exposing the photo resist to light;

removing the unmasked areas of anti-reflective coating and undoped silicon; and stripping the photo resist masking the gate regions.

17. The method as recited in claim 16, wherein the anti-reflective coating is selected from the group consisting of titanium nitride, silicon oxy-nitride, silicon nitride and silicon dioxide.

18. The method as recited in claim 15 wherein the planarizing of the dielectric layer includes an etch-back process.

19. The method as recited in claim 15 wherein the planarizing of the dielectric layer includes a chemical mechanical polishing process.

20. The method as recited in claim 15, wherein the P-type dopant includes Boron.

21. The method as recited in claim 15, wherein the N-type is selected from the group consisting of: Phosphorus, Arsenic, Antimony and Bismuth.

22. A semiconductor device fabricated with the method of claim 15.

* * * * *